United States Patent
Zussy et al.

(10) Patent No.: US 8,302,278 B2
(45) Date of Patent: Nov. 6, 2012

(54) METHOD AND DEVICE FOR SEPARATING A STRUCTURE

(75) Inventors: Marc Zussy, Saint Egreve (FR); Léa Di Cioccio, Saint Ismier (FR); Christophe Morales, Le Pont de Claix (FR); Hubert Moriceau, St Égrève (FR)

(73) Assignee: Commissariat a l'Energie Atomique, Paris (FR)

( * ) Notice: Subject to any disclaimer, the term of this patent is extended or adjusted under 35 U.S.C. 154(b) by 988 days.

(21) Appl. No.: 12/341,645

(22) Filed: Dec. 22, 2008

(65) Prior Publication Data

US 2009/0165277 A1   Jul. 2, 2009

(30) Foreign Application Priority Data

Dec. 28, 2007   (FR) .................................. 07 60437

(51) Int. Cl.
   *B23P 11/00*   (2006.01)
   *B23P 19/00*   (2006.01)
(52) U.S. Cl. ............... 29/426.1; 29/426.4; 29/426.5; 29/239; 29/284; 29/762
(58) Field of Classification Search ........... 29/426.1, 29/426.3, 426.4, 426.5, 426.6, 239, 284, 29/762, 764
   See application file for complete search history.

(56) References Cited

U.S. PATENT DOCUMENTS

| | | | | |
|---|---|---|---|---|
| 4,366,925 | A * | 1/1983 | Fanene | 228/20.1 |
| 5,897,743 | A * | 4/1999 | Fujimoto et al. | 156/750 |
| 5,938,882 | A * | 8/1999 | Bryant et al. | 156/701 |
| 7,182,234 | B2 * | 2/2007 | Rayssac et al. | 225/2 |
| 2004/0144487 | A1 * | 7/2004 | Martinez et al. | 156/344 |

FOREIGN PATENT DOCUMENTS

| DE | 31 02 766 A1 | 2/1982 |
|---|---|---|
| EP | 1 385 683 B1 | 2/2004 |

OTHER PUBLICATIONS

J. Bagdahn and M. Petzold "Debonding of Wafer-Bonded Interfaces for Handling and Transfer Applications", in Wafer Bonding Applications and Technology, published by Springer, pp. 471-494.
French Search Report Patent No. 0760437, dated Aug. 14, 2008.

* cited by examiner

*Primary Examiner* — Jermie Cozart
(74) *Attorney, Agent, or Firm* — Brinks Hofer Gilson & Lione

(57) ABSTRACT

A method of separating a structure including a fragile zone delimiting two substructures to be separated, where at least one plane blade is advanced in a separation plane corresponding to a median plane of the fragile zone, from an entry edge of the structure in a direction of advance toward an exit edge of the structure, so as to cause progressive separation of the two substructures, and where the inclination of the blade in the separation plane is varied relative to the direction of advance.

31 Claims, 7 Drawing Sheets

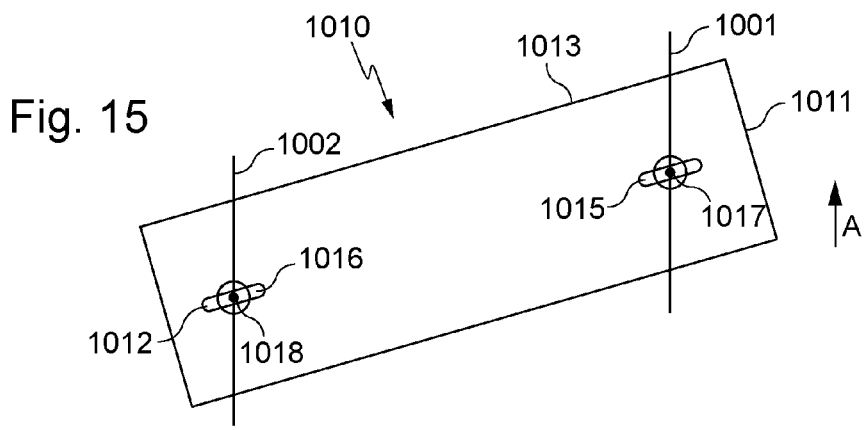
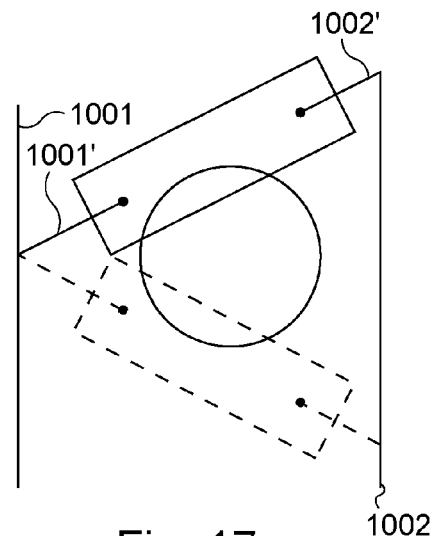
Fig. 15
Fig. 16
Fig. 17
Fig. 18
Fig. 19

Fig. 28
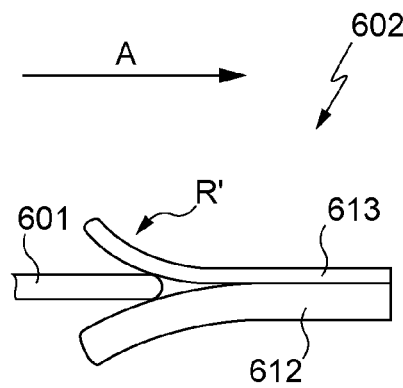
Fig. 29
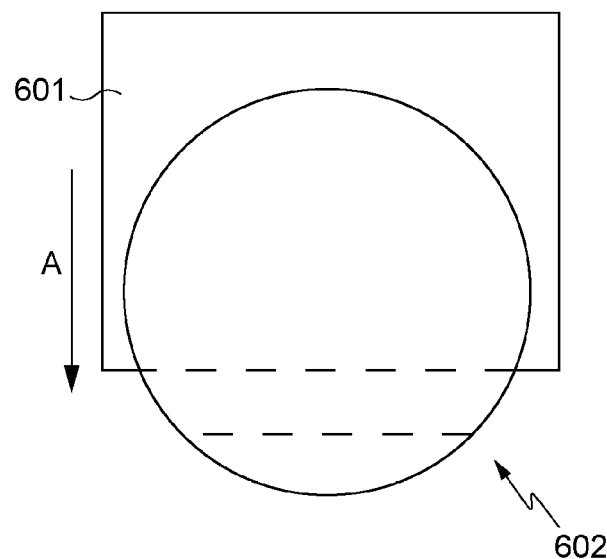
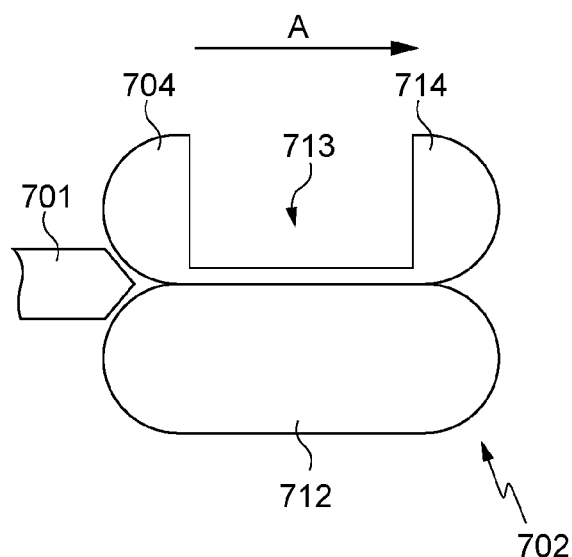
Fig. 30
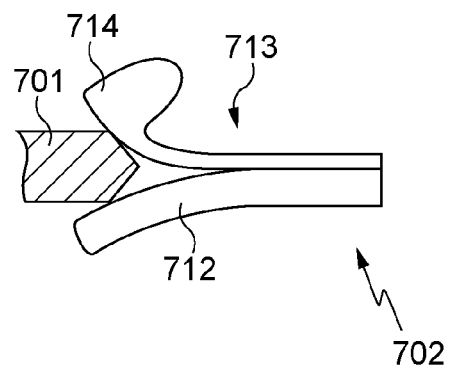
Fig. 31

METHOD AND DEVICE FOR SEPARATING A STRUCTURE

PRIORITY CLAIM

This application claims priority to French Patent Application No. 0760437 filed Dec. 28, 2007.

TECHNICAL FIELD

The invention concerns a method of separating a structure, useful in the fields of micro-electronics, optics and opto-electronics, for example. The invention also concerns an associated separation device.

BACKGROUND

The invention aims in particular to separate a structure into two parallel parts (or substructures). In the field of micro-electronics, it is often required to separate, within its thickness, a structure made up of stacked materials, at a bonding interface between two plates of materials bonded to each other, or in a plane of weakness, or in a plane of stresses existing in the stacked structure or at a deposition interface.

One known technique for separating bonded plates, represented in FIGS. 1 and 2, involves inserting a blade 1 by pushing it from the exterior of the bonded plates 2 and 3 at the level of the bonding interface 4 toward the interior of the latter interface and in its plane, in a radial direction. This leads to progressive opening of the bonded structure, a debonding front 5 being established in front of the blade, which therefore has a wedging role.

The blades used typically have a thickness of the order of one millimeter, possibly with a leading edge having a radius of curvature of the order of ten microns thick (or alternatively an angular leading edge as in FIG. 1). The thicker the blade, the wider the debonding area induced by introducing the blade and the further ahead of the blade the debonding front, because of the wedging effect.

Note that the area of the debonding zone induced by introducing the blade is inversely proportional to the bonding energy between the plates. Because of this, inserting a blade as represented in FIGS. 1 and 2 has been used to determine the bonding energy between plates.

There is also known a method of separating plates involving simultaneous insertion of a number of blades at different places at the periphery of the interface between the plates, each blade being directed toward the center of the stacked structure (see "Debonding of Wafer-Bonded Interfaces for Handling and Transfer Applications", J. Bagdahn and M. Petzold, in Wafer Bonding Applications and Technology, published by Springer).

Separation of the bonded structure is therefore initiated from a number of peripheral zones, the central zone becoming debonded when the debonding fronts induced by the blades converge at it, for example.

Another known method for separating bonded plates, described in the document EP 1 385 683 B1, using a blade the leading edge of which is of concave shape, with a curvature corresponding to that of the periphery of the plates to be separated.

The movement of the blade is a movement in radial translation from the periphery toward the center of the structure to be separated, along the bonding interface, simultaneously bringing about separation of the plates over a large portion of the circumference of the interface.

In a variant of this latter method, represented in FIG. 3, as well as a concave blade 10, lateral blades 11 and 12 are applied to the structure, at a distance from the zone to which the concave blade 10 is applied, on either side thereof, and also in the plane of the bonding interface.

Each lateral blade 11 advances along a rectilinear trajectory along the flank of the plates, in the plane of the interface, in contact with the plates, and moving away from the zone opened by the concave blade 10, thus contributing to the separation of the two plates.

The above techniques have various drawbacks.

Firstly, inserting and advancing a blade causes deformation of the layers of material close to the separation zone. This deformation is critical in particular when, as represented in FIG. 4, one of the substructures, namely the thin substructure 2', is thin compared to the thickness of the blade 1, in which case the debonding front is close to the blade 1 and the curvature R to which the thin substructure 2' is subjected is such that it can break.

What is more, the blade used must not be too thin, given the forces to which it is subjected, which include compression forces when it is pushed and friction against the debonded surfaces of the plates. As a result a blade that is too thin manipulated in accordance with the known separation methods leads in practice to separation results that are not reproducible.

To this is added the possibility of damage to the separated surfaces caused by the introduction of impurities in the zone of movement of the blade.

Finally, in some cases, rebonding of the two separated substructures occurs after the blade has passed.

An object of the invention is to alleviate the aforementioned drawbacks by proposing a separation method and device that are well controlled even for separating structures including at least one thin substructure (for example less than 50 microns thick) to be separated over a large area.

To this end the invention proposes a method of separating a structure including a fragile zone delimiting in that structure two substructures to be separated, wherein at least one plane blade is advanced in a direction of advance in a separation plane corresponding to a median plane of the fragile zone, from an entry edge of the structure in the direction of an exit edge of the structure, so as to cause progressive separation of the two substructures, the method being characterized in that the inclination of the blade in the separation plane relative to the direction of advance is varied.

This method varies the distribution of the forces exerted on the structure by the blade. This improves the control of the separation process. The separation process being better controlled, a thinner blade can be used. This reduces the risk of damaging the surfaces laid bare by the separation and the risk of the substructures breaking. Finally, the method achieves separation of better quality, including when one of the substructures is thin.

According to an optional feature, the blade is advanced by applying forces to lateral portions of the blade, advantageously in traction.

This feature, novel in itself, can be implemented regardless of the movement of the blade, but it is of particular benefit in the context of applying a movement during which the inclination of the blade in the separation plane is modified as it advances.

Thanks to this feature, it is possible for there to be no thrust load on the blade as it advances between the two substructures.

It follows that it is not necessary for the blade to be very stiff, and so it can be thinner.

The method can therefore be used to separate structures including at least one thin substructure. According to an optional feature, the inclination of the blade is varied by causing it to turn about an instantaneous center of rotation situated in the separation plane (which point can be fixed or mobile relative to the blade).

According to an optional feature, the movement of the blade can include a component in translation in the separation plane perpendicular to the direction of advance.

According to an optional feature, a separation front delimiting within the retaining zone an open zone in which the two substructures are locally separated and a closed zone in which the two substructures are still joined, the inclination of the blade is varied in the separation plane to modify a curvature of said separation front.

According to an optional feature, a separation front delimiting within the retaining zone an open zone in which the two substructures are locally separated and a closed zone in which the two substructures are still joined, the inclination of the blade is varied in the separation plane to modify a length of said separation front, for example to increase it.

A length of the separation front can be taken between two lateral edges of the retaining zone.

According to one advantageous feature, the inclination is varied alternately in one direction and the other, as the blade advances.

According to an optional feature, the retaining zone or the fragile zone is a bonding interface produced by bonding a surface of a first of the two substructures and a surface of the second of the two substructures.

According to an optional feature, the retaining zone or the fragile zone is an internal zone of said structure mechanically weakened by a physical and/or chemical modification to which a constituent of said internal zone is subjected.

This can be a porous buried zone or a fragile buried zone created by implantation, for example implantation of gaseous species, or a buried film of lower viscosity, or a deposition interface.

According to an optional feature, one of the two substructures has a thickness less than 50 μm measured perpendicularly to said application plane.

According to an optional feature, one of the two substructures has a thickness less than 15 μm measured perpendicularly to said application plane.

According to optional features, the leading edge of the blade is linear, curved or angular.

According to an optional feature, the leading edge can be discontinuous. The blade can be serrated, for example, or consist of a number of elements, to which a movement is imparted as described above, the same or different for all the elements but with the same direction of advance.

According to an optional feature, the blade lies in its plane, parallel to the direction of advance, so that it remains disposed between the two substructures throughout the separation process.

In this way, the blade prevents rebonding by contact of the two substructures after the leading edge of the blade has passed.

According to an optional feature, a suction plate holds the structure in position by application of suction to a free surface of the structure.

This retains or immobilizes the substructure to which suction is applied during the separation operation, despite the forces applied by the blade.

According to an optional feature, the inclination movement of said blade is slaved to a signal from a video camera, for example an infrared video camera, filming the structure, for example in a direction transverse to the plane of separation.

Such infrared video cameras can be used to view the separation front. The rate of variation of the inclination of the blade in its plane and the advance of the ends of the blade can be slaved, for example to a separation front advance parameter.

According to an optional feature, the inclination of the blade is varied in a range of at least +/−20° relative to a reference inclination.

In practice, the inclination varies as a function of the structure and its constituent materials. It can take any value, for example 1° or even less, 10°, 30° or 90° or even more.

Furthermore, for the inclination variation, a lower rate of variation of inclination can be chosen if the structure consists of fragile materials. Likewise, a lower rate of variation of inclination can be chosen if the energy bonding the two structures together is high.

According to an optional feature, the structure comprises a semiconductor material.

The semiconductor material can be, for example: germanium, silicon, a silicon-germanium alloy $Si_xGe_y$, a III-V semiconductor compound, in particular GaAs, GaN or InP or a II-VI semiconductor compound such as ZnS, ZnSe or CdTe, or SiC.

According to an optional feature, the structure comprises an insulative material.

The insulative materials used can be glass, sapphire, lithium tantalate $LiTaO_3$ or lithium niobate $LiNbO_3$, diamond, garnet, alumina or polymers. A glass/glass structure is particularly preferable.

According to an optional feature, the structure comprises a conductive material.

A conductive material can be chosen from silicides, germanides or indium-tin oxide ITO, for example.

The material chosen can also be a metal, for example Cu, Ni, W, Pd or Pt.

According to an optional feature, the two substructures contain different materials.

A heterogeneous structure is advantageously used, for example, in particular an Si/glass structure, or Si/sapphire, $Si_xGe_y$/glass or germanide/glass structure, the retaining zone being a zone of bonding between the two materials.

According to an optional feature, one of the substructures has, in a direction parallel to the plane of the retaining zone or to the separation plane, from the edge toward the interior of the structure, a zone of maximum thickness and then a zone of minimum thickness significantly thinner than the zone of maximum thickness, the thickness being measured perpendicularly to the separation plane.

The thin zone, far from the edges of the structure, can result from thinning carried out beforehand perpendicularly to the plane of the retaining zone. The thick zone can have the original thickness of the substructure.

This enables a thin film of material to be separated from a structure to which the film was initially bonded, the film being stiffened by the presence of the thick zone, which can constitute a peripheral reinforcement around the film. This reduces the risk of the film breaking or becoming deformed.

According to an optional feature, the blade has a thickness at most equal to 100 μm.

The invention uses thin blades and therefore imposes only small deformations on the layers to be separated at the separation front. This reduces the risk of the separated structures breaking.

In practice at least the thickness of the blade transversely to the plane of the blade and/or the elasticity and/or the hardness of the blade is chosen as a function of the structure to be separated.

For example, a thickness of 80 µm is suitable for separating a 50 to 100 µm thick glass membrane from a 725 µm thick silicon substrate to which the membrane is bonded.

Moreover, the blade can be rigid or flexible, and in this case can take the form of a roll that can be unrolled, for example.

According to an optional feature, the blade comprises aluminum.

This material offers good corrosion resistance and good mechanical performance. In an advantageous variant, the blade, for example of aluminum, is covered with a film of Teflon™ facilitating introduction of the blade between the bonded structures and further preventing rebonding of the structures once debonded.

According to an optional feature, the blade comprises a plastic film or a thermoplastic polymer.

According to an optional feature, the blade comprises Kapton®.

According to an optional feature, the blade comprises paper.

According to an optional feature, the blade comprises a composite material such as carbon fiber.

Clearly, depending on the material chosen for the blade and the chosen thickness, a blade is obtained that can be described as rigid, flexible or semi-rigid.

The invention also provides a device for separating a structure including a fragile zone delimiting two substructures or a retaining zone between two substructures within said structure, the device including a plane blade and means for advancing the plane blade in a direction of advance in a separation plane corresponding to the median plane of the fragile zone or a plane parallel to a plane of the retaining zone, from an entry edge of the structure, to cause progressive separation of the two substructures, the device being characterized in that it includes means for varying the inclination of the blade in the separation plane relative to the direction of the advance.

According to an optional feature, said means for varying the inclination of the blade in the separation plane relative to the direction of advance vary said inclination in one direction and in the opposite direction.

According to an optional feature, means for advancing a plane blade in a direction of advance include a guide rail.

According to an optional feature, the blade has a leading edge between two ends, an oblong opening extending transversely to the direction of advance and situated in the vicinity of each end, said blade being connected to two parallel linear rails by rods engaged in the oblong openings.

The freedom of the rod to move in the oblong hole enables the blade to move in rotation in its plane or to move in translation in the lengthwise direction of the oblong hole.

According to an optional feature, the blade is connected to rails by arms of variable length.

According to an optional feature, the blade has a thickness at most equal to 100 µm.

According to an optional feature, the blade has a thickness at least equal to 50 µm.

According to an optional feature, the blade is flexible.

According to an optional feature, movement of said blade is caused by a motor winding up the blade at one end of the blade.

According to an optional feature, the blade comprises aluminum.

According to an optional feature, the blade comprises a plastic film.

According to an optional feature, the blade comprises Kapton®.

According to an optional feature, the blade comprises paper.

According to an optional feature, the blade comprises a composite material such as carbon fiber.

According to an optional feature, a leading edge of the blade is beveled.

This facilitates engaging the blade in the structure to be cut in the separation plane and minimizes the stress concentration near the separation front.

Alternatively, a leading edge of the blade can be rounded.

According to an optional feature, the device further includes a suction plate for retaining the structure by suction.

According to an optional feature, it further includes a video camera, for example an infrared video camera, for viewing the structure, for example in a plane perpendicular to the application plane.

The video camera is used to view the advance of the separation front between the two substructures.

According to an optional feature, the device further includes means for slaving the movement of the blade to a signal from the video camera.

Only the rotation component or the translation component of the movement can be slaved.

According to an optional feature, the suction plate is adjustable in height and in inclination.

This enables the structure to be separated to be moved to a position in which the blade is offered up to the retaining zone.

BRIEF DESCRIPTION OF THE DRAWING

Objects, features and advantages of the invention emerge from the following description, given by way of illustrative and nonlimiting example, with reference to the appended drawings, in which:

FIG. 15 is a view from above of a blade of a separation device of one embodiment of the invention.

FIG. 16 is a diagrammatic view from above of one embodiment of a separation device of the invention.

FIG. 17 is a view from above of one embodiment of a separation device of the invention.

FIG. 18 is a diagrammatic side view of the FIG. 16 device.

FIG. 19 is a diagrammatic side view of another separation device of the invention.

FIG. 28 is a diagrammatic view in section of an application of a method of the invention to the separation of a structure consisting of two substructures, one of which is thinner than the other.

FIG. 29 is a view of that application from above.

FIG. 30 is a diagrammatic view in section of an application of a method of the invention to the separation of a structure consisting of two substructures, one of which has a thick peripheral border around a thinner central portion, before engaging a blade.

FIG. 31 is an analogous view of that application, after engagement of the blade.

DETAILED DESCRIPTION

Figure 1:
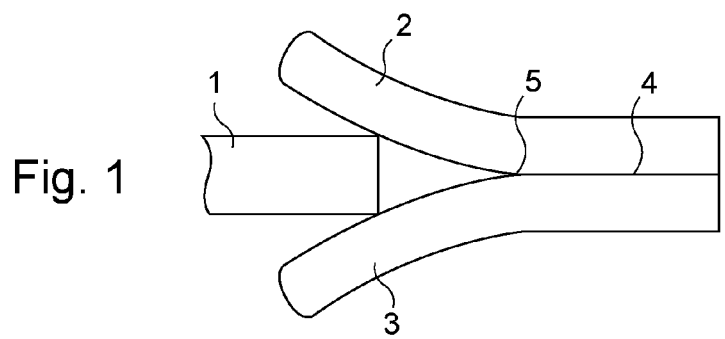
FIG. 1 is a diagrammatic view in section of a structure consisting of two plates bonded to each other and a blade applied between the two plates in a prior art debonding method.
Figure 2:
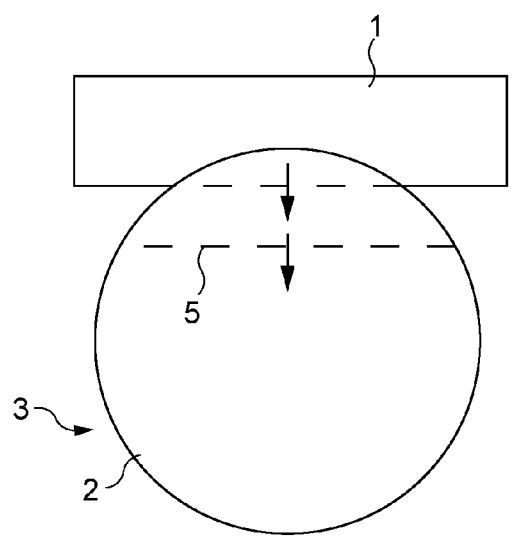
FIG. 2 is a view of the same structure and the same blade in the same position, but as seen from above.
Figure 3:
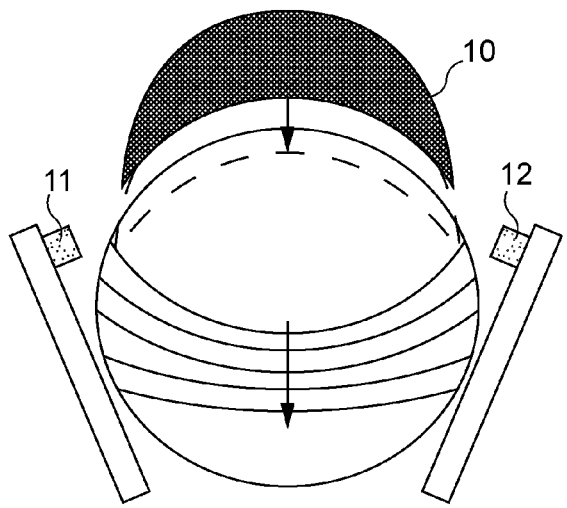
FIG. 3 is a view from above of a structure to which a main blade and two secondary blades are applied in a plane of the structure in another prior art method.
Figure 4:
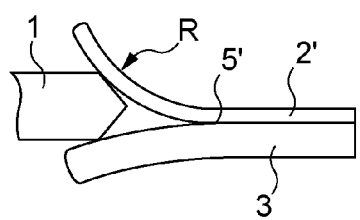
FIG. 4 is a side view of a prior art structure consisting of two bonded plates and a blade applied between the two plates, one of the plates being thin compared to the blade and the other plate.
Figure 5:
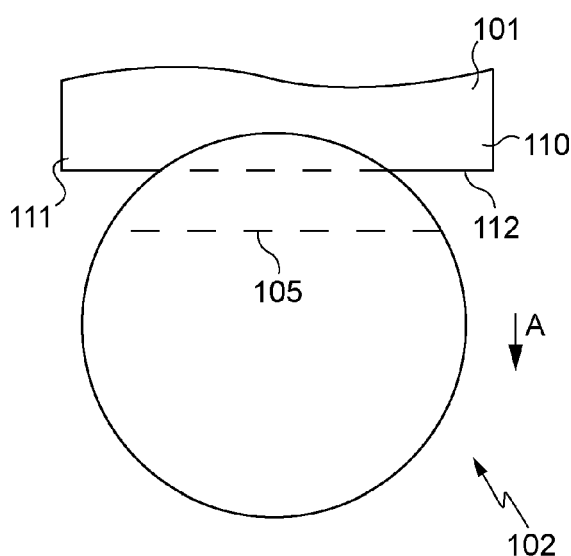
FIG. 5 is a diagrammatic view from above of a structure in a plane of which a blade is applied, the blade being close to an entry edge of the structure at the start of execution of a method of the invention.

Referring to FIG. 5, a cylindrical structure 102, for example of silicon, consisting of two plates bonded to each other (in a similar manner to the structure shown in FIG. 1) is disposed horizontally. Alternatively, the structure includes a porous buried zone or a fragile buried zone obtained by implantation of one or more gaseous species and delimiting two substructures to be separated.

A blade 101 is inserted in the plane of the bonding interface of the two plates, from an edge of that interface referred to here as the entry edge, in contact with the two plates. Broadly speaking, the blade has two lateral ends 110 and 111 and a leading edge 112 that here is rectilinear. Here this edge is perpendicular to a radius of the structure 102 (not shown).

A debonding front 105 is established essentially parallel to the leading edge 112, in front of it, between the two plates of the structure 102. This debonding front 105, here similar to a curve and to be more precise to a straight line, is where the detached materials of the two plates join.

Figure 6:
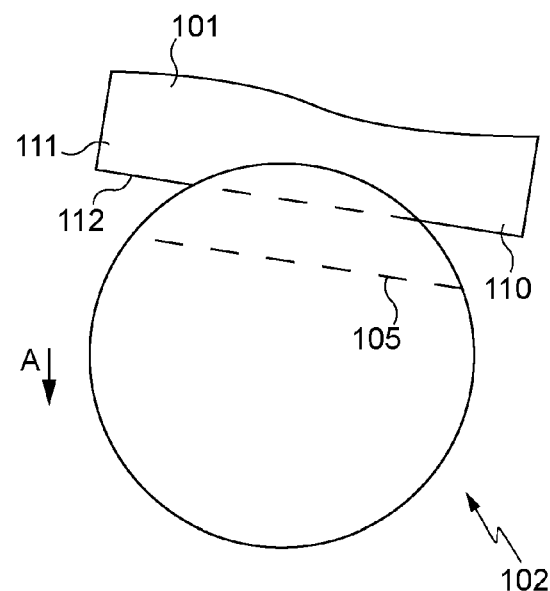
FIG. 6 is an analogous view of the structure, after a first movement of the blade.

Referring to FIG. 6, the blade 101 is advanced in a general direction of advance A between the two plates of the structure 102 in the plane of the interface.

The end 110 of the blade advances, in the direction of advance A, a greater distance than the end 111. The general inclination of the blade in its plane relative to the general direction of advance has therefore been modified.

The debonding front 105 has advanced, still in front of the leading edge 112. It has been moved toward a greater separation of the two plates, the area of the open zone increasing and the area of the closed zone decreasing.

Figure 7:
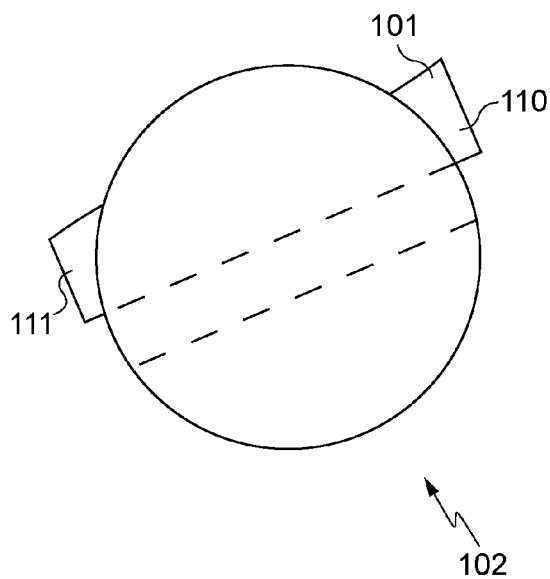
FIG. 7 is another analogous view of the structure, after further movement of the blade, the blade advancing into the structure.

Referring to FIG. 7, the blade 101 is again advanced in the general direction of advance A, between the two plates of the structure 102, in the plane of the interface. The end 110 of the blade has advanced a shorter distance than the end 111, and the general inclination of the blade in its plane has therefore again been modified.

Figure 8:
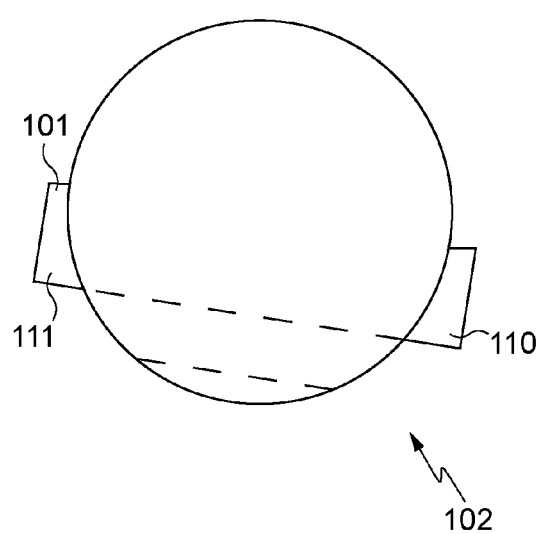
FIG. 8 is another analogous view of the structure, after further movement of the blade, the blade being close to an exit edge of the structure.

Finally, referring to FIG. 8, the blade 101 is again advanced in the general direction of advance A, between the two plates, in the plane of the interface. The end 110 has advanced a greater distance than the end 111, the general inclination of the blade therefore having been modified.

At this stage the blade is in the vicinity of the edge of the structure 102 opposite the entry edge, called the exit edge, through which the blade can exit from the structure 102.

A second embodiment of a method of the invention is described next with reference to FIGS. 9 to 11.

Figure 9:
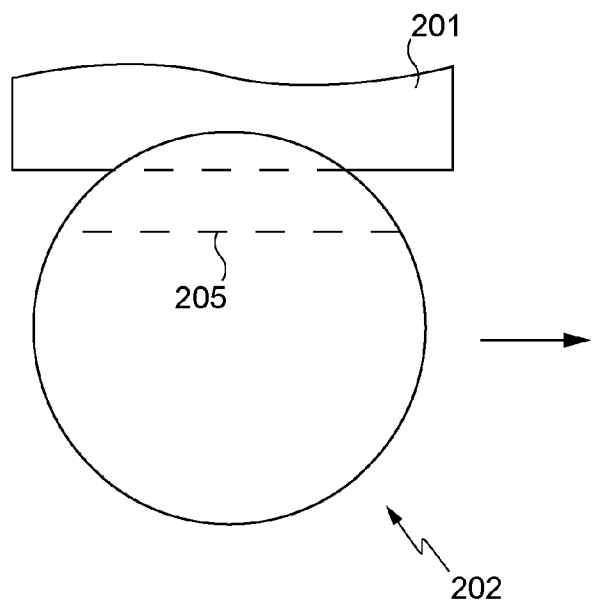
FIG. 9 is a diagrammatic view from above of a structure in a plane of which a blade is applied, at the start of execution of a second embodiment of a method of the invention.

Referring to FIG. 9, a cylindrical structure 202 consisting of two plates is disposed in the same manner as in FIG. 5, a blade 201 being inserted in the plane of the bonding interface of the two plates, and a debonding front 205 being established in front of the leading edge of the blade.

Figure 10:
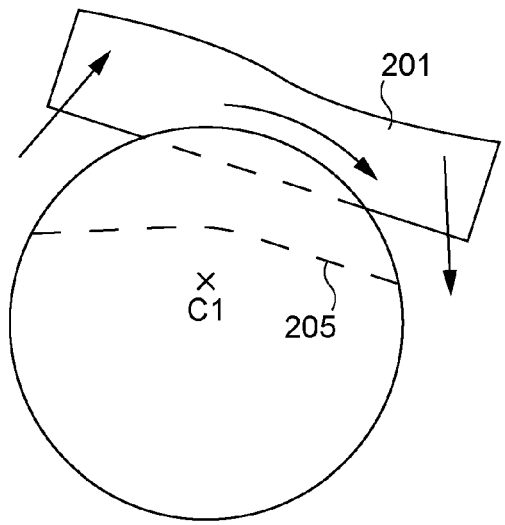
FIG. 10 is an analogous view of the structure, after movement of the blade from the FIG. 9 configuration.

Referring to FIG. 10, the blade 201 has rotated in its plane. The rotation is effected about a center C1 of rotation situated vertically in line with the structure 202, for example, in the vicinity of its center in the clockwise direction. Other positions for C1 are possible, of course: for example, C1 can be located at the level of the blade.

The debonding front 205 has moved over a portion of its length and has assumed a curved shape, the zone still bonded being convex and the debonded zone, of greater area than in FIG. 9, being concave.

Figure 11:
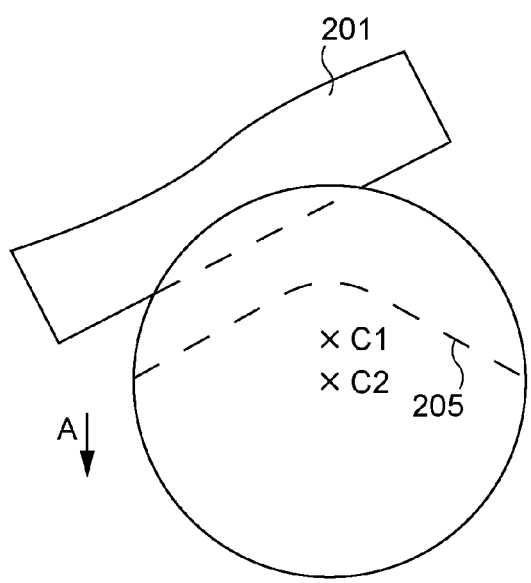
FIG. 11 is an analogous view of the structure, after further movement of the blade.

Referring to FIG. 11, the blade 201 has undergone a new rotation in its plane from the FIG. 10 configuration. The rotation is effected above a center C2 of rotation, in the anticlockwise direction. The center C2 is obtained, in the present embodiment, from the center C1 of rotation by movement in translation in the direction of advance A.

The rebonding front has moved over a portion of its length and its curvature has been modified. The debonded area is larger than in the FIG. 10 configuration.

Separation of the structure 202 then continues, for example by movement in translation of the blade 201 in the direction of advance A, with or without further variation of the inclination of the blade in its plane.

In one variant, the rotation movement can be effected before and/or at the same time as the movement in translation in the direction of advance. It can be associated with a movement in translation perpendicularly to the direction of advance.

Figure 12:
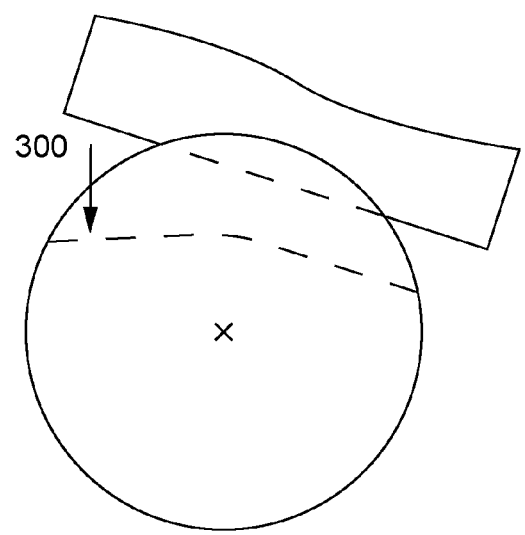
FIG. 12 is a view showing a phenomenon of rebonding when using a prior art method.
Figure 13:
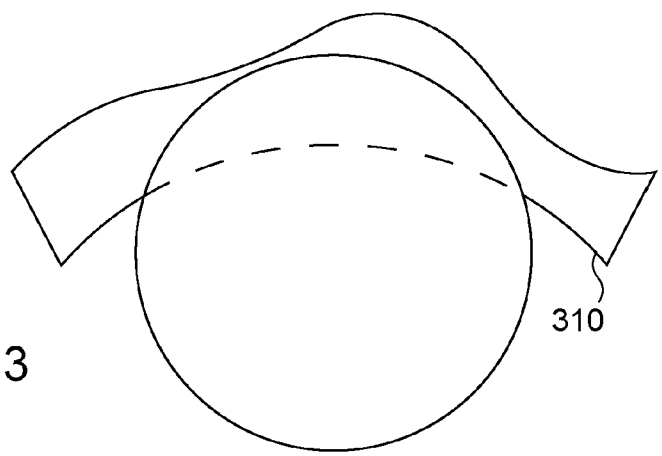
FIG. 13 is a view of a blade, a variant of the invention.
Figure 14:
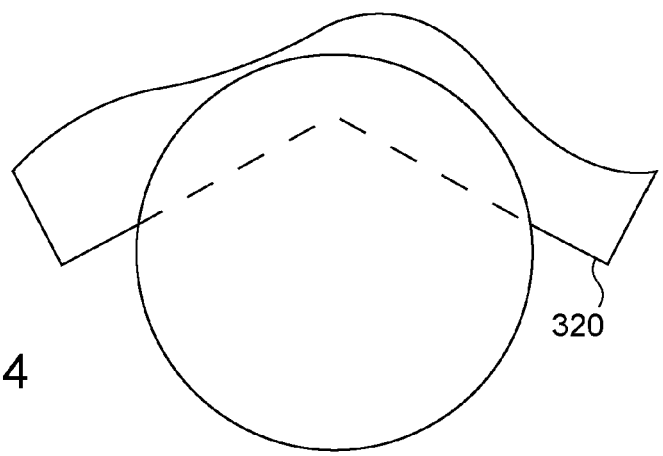
FIG. 14 is a view of another blade of another variant of the invention.
Figure 25:
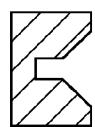
FIGS. 25 to 27 are views in section of the leading edges of three systems of blades that can be used to implement a method of the invention.
Figure 27:
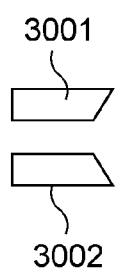

Referring to FIGS. 12 to 14, note that some of the debonded zones can rebond, for example in a zone 300. To limit this phenomenon, it is advantageous to use a blade having a curved leading edge, for example a convex leading edge 310 or an angular leading edge 320 or even a leading edge consisting of a number of non-continuous portions (as shown in FIG. 25), or even a number of blades (as shown in FIG. 27).

FIGS. 15 to 18 show a separation device of a first embodiment of the invention.

Referring to FIG. 15, the device includes two rails 1001 and 1002 parallel to each other and a plane blade 1010 the plane of which is parallel to the two rails.

The length of the blade is transverse to the two rails between two ends 1011 and 1012, and has a leading edge 1013 whose length is in the lengthwise direction of the blade.

The blade is perforated so as to be driven on the rails, in a direction of advance (A) parallel to the rails, by two motors (not shown) operating independently of each other.

The perforation is produced in the form of oblong holes 1015 and 1016 close to the two ends 1011 and 1012 of the blade and passing through the blade perpendicularly to its plane.

Fixings (for example bolts) constituting rods 1017 and 1018 inserted into the oblong holes connect the blade to each rail and to the corresponding motor.

This fixing method enables the blade to rotate relative to the rails about an axis perpendicular to its plane and thus to vary its inclination in its plane. The rotation relative to the rails can optionally be combined with a general movement in translation in the direction of advance A.

Referring to FIG. 16, the separator device includes the blade 1010 and the rails 1001 and 1002 on which the blade 1010 is mounted, as well as motors 1003 and 1004 driving the blade 1010 on the rails in the general direction of advance A.

Here the two motors can be controlled by a user, but they could also be controlled by a computer. It is important that they can be controlled independently of each other, to vary the inclination of the leading edge 1013 in the plane of the blade.

A suction plate 1020 is placed between the rails, to cover a cylindrical structure, for example in silicon, offered up to the blade 1010 and to retain that structure by suction during the separation operation.

This suction plate is advantageously at least partly transparent to infrared and/or visible light to enable observation during separation: it can be apertured and/or consist mainly of glass. It can also be in Plexiglas or quartz, for example.

Note finally that the blade 1010 has a width in the direction of advance A such that it can cover the structure to be separated entirely during the separation operation.

Referring to FIG. 17, in a variant, the blade is fastened to the rails 1001 and 1002 via arms 1001' and 1002' of variable length.

FIG. 18 is a side view of the separation device from FIG. 16. A structure 402 consisting of two substructures, here in silicon, is placed under the suction plate 1020.

The suction plate retains one of the substructures, for example the thicker of the two or alternatively the thinner.

The rail 1001 and the rail 1002 (not shown), combined with the motor 1003 and the motor 1004 (not shown), advance the blade 1010 in the general direction of advance A.

The suction plate 1020 is adjustable in height and in inclination by vernier and micrometric screws, enabling the blade 1010 to be applied parallel to the plane of separation of the two substructures of the structure 402.

An infrared video camera 1030 is disposed facing the structure 402, to view it in a direction perpendicular to the plane of the structure 402, through the suction plate 1020, which in the present embodiment is transparent to infrared light or apertured, an infrared light source 1050 being disposed under the structure 402, for example.

The infrared video camera 1030 is therefore able to view a debonding front forming between the two substructures of the structure 402 and its movement.

The signals measured by the infrared video camera 1030 are used by a computer 1040 to slave the movement of the motors 1003 and 1004, independently of each other, to vary the inclination of the blade 1010 in its plane as a function of the movement of the debonding front observed between the two substructures of the structure 402.

In another embodiment of a separation device of the invention, represented in FIG. 19, the structure 402 is placed under a suction plate 1021 and an infrared video camera 1031 is installed under the structure 402, on the side opposite the suction plate 1021.

As previously, a motor 1003 controls the movement of the blade 1010 on the rail 1001 and a second motor 1004 (not shown) controls the movement of the blade 1010 on the rail 1002 (not shown) so that the blade moves forward globally in the general direction of advance A and its inclination is varied in its plane, thus enabling controlled separation of the structure 402.

Figure 20:
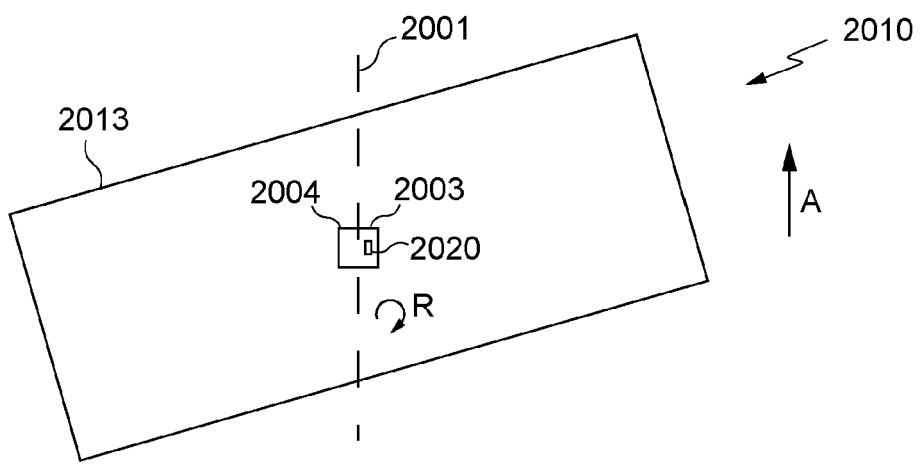
FIG. 20 is a view from above of another blade of a separation device of another embodiment of the invention.

FIG. 20 shows another embodiment of a blade system for implementing a method of the invention.

It includes a rectilinear rail 2001 and a plane blade 2010 parallel to the rail 2001. The blade is fixed to the rail along an axis 2020 perpendicular to the plane of the blade. A motor 2003 drives the blade in translation on the rail in a general direction of advance A. The blade also has a leading edge 2013.

A motor 2004 and a pivot connection with an axis 2020 enable the blade also to perform a movement in rotation R in its plane relative to the rail 2001, the consequence of which is to vary its inclination in its plane.

FIGS. 21 to 24 show various leading edge profiles of blades used to implement a method of the invention with a device of the invention.

Figure 21:
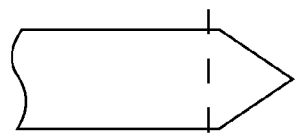
FIGS. 21 to 24 are views in section of the leading edges of four blades that can be used to implement a method of the invention.

FIG. 21 shows a pointed blade leading edge: the leading edge has two plane surfaces converging towards each other and forming a corner. The edge of the blade is therefore angular, at least when it is observed at the scale of the blade.

Figure 22:
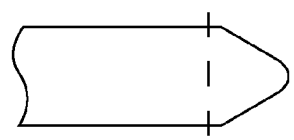

FIG. 22 shows a partially rounded blade leading edge: it includes two plane surfaces converging towards each other but which are rounded just before joining.

Figure 23:
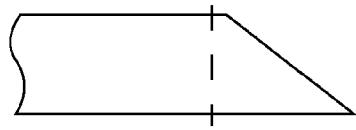

FIG. 23 shows a beveled leading edge.

Figure 24:
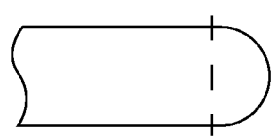

FIG. 24 shows an entirely rounded blade leading edge.

Figure 26:
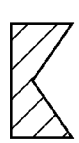

FIGS. 25 to 27 show other blade leading edges used in variants. The leading edge can be curved (concave or convex) or angular. In one variant two blades 3001 and 3002 having identical directions of advance are used.

The method of the invention is implemented interchangeably with any of these blades, which lend themselves particularly well to fine control of the separation operation.

FIGS. 28 and 29 show an application of a method of the invention to separating a structure 602 consisting of two plates 612 and 613 having a diameter of the order of 20 cm.

One of the plates is a thick plate 612 and the other is a thin plate 613, which is less than 50 µm thick, here 35 µm thick. The bonding energy between the plates is of the order of 350 mJ/m$^2$.

Separation is effected by means of an aluminum blade 601 25 cm long parallel to its leading edge. The length of the blade is essentially a function of the width of the structure to be separated.

The blade used has a thickness of 50 microns and a width in its plane, perpendicular to the leading edge, greater than the dimension of the plates 612 and 613. The blade is manipulated by the device shown in FIGS. 17 and 18.

The blade 601 advances in a general direction of advance A, with an inclination in its plane that varies, here according to the embodiment of the method shown in FIGS. 5 to 8.

During a step of inclining the blade in its plane, one end of the blade, mounted on a first motor, moves forward at a speed of 1 mm.min$^{-1}$ and the other end of the blade mounted on a second motor moves forward at a speed of 1 cm.min$^{-1}$.

FIG. 28 shows that the thin blade 601 imparts a slight curvature to the plate 613 (whence a large radius of curvature R'), given the thickness of the plate 613.

Moreover, varying the inclination of the blade 601 varies the distribution of the forces exerted on the structure by the blade, enabling good control of the advance of the blade 601.

This achieves good control of separation and produces separated surfaces of good quality.

FIG. 29 shows that the width of the blade 601 perpendicular to its leading edge is such that, even when the blade 601 is approaching the exit edge of the structure 602, the blade is disposed between the plates 612 and 613 over the whole of the area of their interface. This eliminates all risk of rebonding of the two plates 612 and 613 to each other during the separation operation.

The plate 613 is then usable for various applications, in particular in the field of micro-electronics. This applies equally to the plate 612.

FIGS. 30 and 31 show a second application of the method of the invention. It relates to separating a structure 702 consisting of two circular plates 712 and 713, one being a thick plate 712 and the other a thin plate 713 having a thick portion 714 at its periphery, along its circumference.

This kind of thin plate 713 having a thick portion 714 at the periphery can be obtained by thinning an initially thick plate, the thinning being applied over a central area of the plate, perpendicularly thereto.

Here the thinning has been produced mechanically, but it can also be produced chemically (by chemical etching) or by a combination of mechanical and chemical means.

A thin blade 701 is used. Its leading edge is beveled. Moreover, the plates 712 and 713 have a chamfer at their circumference. The shape of the blade and the shape of the structure therefore facilitate guiding the blade from outside the structure toward the interface connecting the plates 712 and 713.

In the method shown in FIGS. 30 and 31, the blade 701 is applied to the retaining zone, or bonding interface, between the plates 712 and 713, causing their local separation. A separation front is established in front of the blade 701. The blade then advances in a general direction of advance A, the inclination of the blade in its plane being modified as it moves forward, as explained above.

Thanks to this method, the separation of the structure consisting of the plates 712 and 713 is controlled and the risk of the structure 713 breaking is limited, the blade 701 used being thin. This results in separation that is overall of good quality, enabling use of the plate 713 for various applications, for example in the field of micro-electronics.

The invention claimed is:

1. A method of separating a structure including a fragile zone delimiting two substructures to be separated, the method comprising:
    advancing at least one plane blade in a separation plane corresponding to a median plane of the fragile zone, from an entry edge of the structure in a direction of advance toward an exit edge of the structure, so as to cause progressive separation of the two substructures, and
    varying an inclination of the at least one blade in the separation plane relative to the direction of advance,
    wherein the at least one blade lies in a plane parallel to the direction of advance, such that the at least one blade remains between the two substructures during the progressive separation.

2. The method according to claim 1, wherein advancing the at least one blade comprises applying traction to lateral portions of the blade.

3. The method according to claim 1, wherein varying the inclination of the at least one blade comprises turning the at least one blade about an instantaneous center of rotation situated in the separation plane.

4. The method according to claim 1, wherein advancing the at least one blade further comprises advancing in a direction perpendicular to the direction of advance.

5. The method according to claim 1, varying the inclination of the at least one blade comprises varying the inclination alternately in one direction and in another direction as the at least one blade advances.

6. The method according to claim 1, wherein the fragile zone comprises a bonding interface between a surface of a first of the two substructures and a surface of a second of the two substructures.

7. The method according to claim 1, wherein the fragile zone comprises a zone mechanically weakened by subjecting a constituent of the fragile zone to physical or chemical modification, or both.

8. The method according to claim 1, wherein the fragile zone comprises a deposition interface.

9. The method according to claim 1, wherein the fragile zone comprises a porous zone.

10. The method according to claim 1, wherein the fragile zone comprises a zone obtained by implantation of gaseous species.

11. The method according to claim 1, wherein one of the two substructures has a thickness less than 50 μm perpendicular to the separation plane.

12. The method according to claim 1, wherein a leading edge of the at least one blade comprises a linear, curved or angular edge.

13. The method according to claim 1, wherein a leading edge of the at least one blade comprises a discontinuous edge.

14. The method according to claim 1, wherein the at least one blade remains between the two substructures throughout the separation process.

15. The method according to claim 1, further comprising holding the structure in position by application of suction to a free surface of the structure from a suction plate.

16. The method according to claim 1, further comprising slaving movement of an inclination of the at least one blade to a signal from a video camera imaging the structure.

17. The method according to claim 16, wherein the video camera comprises an infrared video camera.

18. The method according to claim 1, wherein one of the substructures has, in a direction parallel to the separation plane, from an edge toward the interior of the structure, a zone of maximum thickness and a zone of minimum thickness significantly thinner than the zone of maximum thickness, wherein the thickness is perpendicular to the separation plane.

19. A device for separating a structure including a fragile zone delimiting two substructures within the structure, the device comprising:
    a plane blade;
    at least one guide rail;
    a motor coupled to the at least one guide rail and configured to advance the plane blade in a separation plane corresponding to a median plane of the fragile zone, from an entry edge of the structure in a direction of advance toward an exit edge of the structure, to cause progressive separation of the two substructures; and
    means for varying an inclination of the plane blade in the separation plane relative to the direction of advance,
    wherein the plane blade lies in a plane parallel to the direction of advance, such that the at least one blade remains between the two substructures during the progressive separation.

20. The device according to claim 19, wherein the means for varying the inclination of the plane blade is configured to vary the inclination in one direction and in an opposite direction.

21. The device according to claim 18, wherein the plane blade comprises a leading edge between two ends, and an oblong opening extending transversely to the direction of advance and situated in the vicinity of each end, wherein the at least one guide rail comprises two parallel linear guide rails, and wherein the plane blade is connected to the two parallel linear guide rails by rods engaged in the oblong openings.

22. The device according to claim 19, wherein the at least one guide rail comprises two guide rails and the blade is connected to the rails by arms of variable length.

23. The device according to claim 19, wherein the blade has a thickness at most 100 μm.

24. The device according to claim 19, wherein a leading edge of the blade comprises a beveled edge.

25. The device according to claim 19, further comprising a suction plate for retaining the structure.

26. The device according to claim 25 further comprising a video camera configured for viewing the structure.

27. The device according to claim 26 further comprising means for slaving movement of the blade to a signal from the video camera.

28. The device according to claim 27, wherein the video camera comprises an infrared video camera.

29. The device according to claim 19, wherein one of the two substructures has a thickness of less than 50 μm measured in a direction perpendicular to the separation plane.

30. A device for separating a structure including a fragile zone delimiting two substructures within the structure, the device comprising:
   a plane blade comprising a leading edge between two ends and oblong openings extending transversely to a direction of advance and situated in the vicinity of each end;
   two parallel linear guide rails connected to the plane blade by rods engaged in the oblong openings;
   means for advancing the plane blade in a separation plane corresponding to a median plane of the fragile zone, from an entry edge of the structure in a direction of advance toward an exit edge of the structure, to cause progressive separation of the two substructures; and
   means for varying an inclination of the plane blade in the separation plane relative to the direction of advance.

31. The device according to claim 30, wherein one of the two substructures has a thickness of less than 50 μm in a direction perpendicular to the separation plane.

* * * * *